(12) United States Patent
Ku et al.

(10) Patent No.: US 10,295,567 B2
(45) Date of Patent: *May 21, 2019

(54) PROBE MODULE SUPPORTING LOOPBACK TEST

(71) Applicant: MPI CORPORATION, Zhubei (TW)

(72) Inventors: Wei-Cheng Ku, Zhubei (TW); Hao Wei, Zhubei (TW); Jun-Liang Lai, Zhubei (TW); Chih-Hao Ho, Zhubei (TW)

(73) Assignee: MPI CORPORATION, Zhubei (TW)

( * ) Notice: Subject to any disclaimer, the term of this patent is extended or adjusted under 35 U.S.C. 154(b) by 294 days.

This patent is subject to a terminal disclaimer.

(21) Appl. No.: 15/172,931

(22) Filed: Jun. 3, 2016

(65) Prior Publication Data
US 2017/0003319 A1    Jan. 5, 2017

(30) Foreign Application Priority Data

Jun. 5, 2015 (TW) .............................. 104118422 A

(51) Int. Cl.
*G01R 31/00* (2006.01)
*G01R 1/073* (2006.01)
*G01R 31/319* (2006.01)
*G01R 31/28* (2006.01)
*G01R 31/317* (2006.01)

(52) U.S. Cl.
CPC ..... *G01R 1/07378* (2013.01); *G01R 31/2889* (2013.01); *G01R 31/31716* (2013.01); *G01R 31/31905* (2013.01)

(58) Field of Classification Search
CPC ............ G01R 1/07342; G01R 1/07378; G01R 31/2889; G01R 31/31716; G01R 31/31905
See application file for complete search history.

(56) References Cited

U.S. PATENT DOCUMENTS

| | | | | |
|---|---|---|---|---|
| 2005/0225382 A1* | 10/2005 | Miller | .............. | G01R 31/31716 327/551 |
| 2007/0245179 A1* | 10/2007 | Noda | ............... | G01R 31/31716 714/718 |
| 2008/0024148 A1* | 1/2008 | Tunaboylu | ......... | G01R 1/07378 324/756.03 |
| 2015/0015290 A1* | 1/2015 | Ku | ..................... | G01R 1/07378 324/754.07 |

* cited by examiner

*Primary Examiner* — Minh N Tang
(74) *Attorney, Agent, or Firm* — Tracy M. Heims; Apex Juris, pllc.

(57) ABSTRACT

A probe module, which supports loopback test and is provided between a PCB and a DUT, includes an adapter, two probes, two inductive components provided at the adapter, and a capacitive component. The adapter has two connecting circuits. An end of each of the probes is connected to one of the connecting circuits, while another end thereof, which is a tip, contacts the DUT. Each of the inductive components has an end electrically connected to one of the connecting circuits, and another end electrically connected to the PCB through a conductive member, which is provided at the adapter, wherein two ends of the capacitive component are electrically connected to one of the connecting circuits, respectively. Whereby, the signal paths are changed by the differences between frequencies of signals, and the transmission path of high-frequency signals is effectively shortened.

6 Claims, 14 Drawing Sheets

PROBE MODULE SUPPORTING LOOPBACK TEST

BACKGROUND OF THE INVENTION

1. Technical Field

The present invention relates generally to a probe, and more particularly to a probe module which supports loopback test.

2. Description of Related Art

To test if every electronic component of a device-under-test (DUT) is electrically connected correctly, a widely used method is to apply a probe card between a tester and the DUT, wherein the probe card is functioned as a transmission interface which transmits test signals and power signals therebetween.

However, with the advancement of digital technology, the operating speed and the signal throughput of electronic devices are increasing, which makes the frequencies of test signals generated by processors of the tester insufficient to satisfy the demand for testing such electronic devices. In order to solve such problem, a DUT may, therefore, be utilized to generate high-frequency signals by itself, and those signals are then transmitted back to the DUT again via a probe card to perform testing.

As shown in FIG. 1, a conventional probe card has a plurality of relays 72 provided on a printed circuit board (PCB) 70 thereof, wherein conductor patterns on the PCB 70 are designed in a way that each relay 72 can be controlled to switch between signal paths of DC test signals provided by a tester 300 and that of high-frequency test signals provided by the DUT 400 for loopback test. In other words, the relays are used as signal path switches. It is well known that, with longer signal path, there would be higher inductance generated thereon. In other words, since each of the signal paths of the high-frequency test signals is quite long, which starts from a probe module 80, sequentially goes through the PCB 70, one of the relays 72, one of capacitors 74, and finally goes back to the probe module 80 through another one of the relays 72 and the PCB 70 again, test signals of higher frequency would lead to higher inductance generated along the signal paths, and therefore cause higher resistance as well. As a result, some of the high-frequency test signals may not be successfully transmitted to the DUT 400, which obviously hinders the process of test.

BRIEF SUMMARY OF THE INVENTION

In view of the above, the primary objective of the present invention is to provide a probe module, which supports loopback test, and effectively shortens the distance to transmit high-frequency signals in a loopback test.

The present invention provides a probe module, which is provided between a printed circuit board (PCB) and a device-under-test (DUT) to perform a loopback test, including an adapter, two probes, two inductive components, and a capacitive component. The adapter has a surface, and is provided with two connecting circuits. Each of the probes has an end electrically connected to one of the connecting circuits, while another end thereof, which is a tip, contacts a tested pad on the DUT. The inductive components are provided at the surface of the adapter, wherein each of the inductive components has two ends, and one of the ends is electrically connected to one of the connecting circuits, while the other one of the ends is electrically connected to the PCB through a conductive member. The capacitive component is provided at the surface of the adapter, wherein the capacitive component has two ends, and one of the ends is electrically connected to one of the connecting circuits, while the other one of the ends is electrically connected to the other one of the connecting circuits.

The present invention further provides a probe module, which is provided between a printed circuit board (PCB) and a device-under-test (DUT) to perform a loopback test, including a substrate, two probes, two inductive components, and a capacitive component. The substrate has a recess thereon, and is provided with two connecting circuits. Each of the probes has an end electrically connected to one of the connecting circuits, while another end thereof, which is a tip, contacts a tested pad on the DUT. The inductive components are provided in the recess of the substrate, wherein each of the inductive components has two ends, and one of the ends is electrically connected to one of the connecting circuits, while the other one of the ends is electrically connected to the PCB through a conductive member. The capacitive component is provided at the surface of the adapter, wherein the capacitive component has two ends, and one of the ends is electrically connected to one of the connecting circuits, while the other one of the ends is electrically connected to the other one of the connecting circuits.

The present invention further provides a probe module, which is provided between a printed circuit board (PCB) and a device-under-test (DUT) to perform a loopback test, including a substrate, two probes, a path changing circuit, and a capacitive component. The substrate has a first surface, a second surface opposite to the first surface, and a third surface located between the first surface and the second surface, wherein the first surface faces the PCB, and the second surface faces the DUT; the substrate is provided with two connecting circuits. Each of the probes has an end electrically connected to one of the connecting circuits, while another end thereof, which is a tip, contacts a tested pad on the DUT. Either the path changing circuit or a capacitive component is provided at the first surface, while the other one is provided at the second surface or the third surface. The path changing circuit comprises two inductive components, each of which has two ends, wherein one end thereof is electrically connected to one of the connecting circuits, while the other end thereof is electrically connected to the PCB through a conductive member. The capacitive component has two ends, and one of the ends is electrically connected to one of the connecting circuits, while the other one of the ends is electrically connected to the other one of the connecting circuits.

The present invention further provides a probe module, which is provided between a printed circuit board (PCB) and a device-under-test (DUT) to perform a loopback test, including a substrate, two probes, a path changing circuit, and a capacitive component. The substrate has a first surface, a second surface opposite to the first surface, and a third surface located between the first surface and the second surface, wherein the first surface faces the PCB, and the second surface faces the DUT; the substrate is provided with two connecting circuits. Each of the probes has an end electrically connected to one of the connecting circuits, while another end thereof, which is a tip, contacts a tested pad on the DUT. Either the path changing circuit or a capacitive component is provided at the third surface, while the other one is provided at either the first surface or the second surface. The path changing circuit comprises two inductive components, each of which has two ends, wherein one end thereof is electrically connected to one of the connecting circuits, while the other end thereof is electrically connected to the PCB through a conductive member. The capacitive component has two ends, and one of the ends is electrically connected to one of the connecting circuits, while the other one of the ends is electrically connected to the other one of the connecting circuits.

The present invention further provides a probe module, which is provided between a printed circuit board (PCB) and a device-under-test (DUT) to perform a loopback test, including a substrate, two probes, a capacitive component, and two inductive components. The substrate has a first surface, a second surface opposite to the first surface, and a third surface located between the first surface and the second surface, wherein the first surface faces the PCB, and the second surface faces the DUT; the substrate is provided with two connecting circuits. Each of the probes has an end electrically connected to one of the connecting circuits, while another end thereof, which is a tip, contacts a tested pad on the DUT. The capacitive component is provided at the second surface, wherein the capacitive component has two ends, and one of the ends is electrically connected to one of the connecting circuits, while the other one of the ends is electrically connected to the other one of the connecting circuits. The inductive components are provided at either the first surface or the third surface, wherein each of which has two ends, wherein one end thereof is electrically connected to one of the connecting circuits, while the other end thereof is electrically connected to the PCB through a conductive member.

The present invention further provides a probe module, which is provided between a printed circuit board (PCB) and a device-under-test (DUT) to perform a loopback test, including a substrate, two probes, a path changing circuit, and a capacitive component. The substrate is provided with two connecting circuits. Each of the probes has an end electrically connected to one of the connecting circuits, while another end thereof, which is a tip, contacts a tested pad on the DUT. The path changing circuit and the capacitive component are provided at the substrate, wherein at least one among the path changing circuit and the capacitive component is embedded in the substrate. The path changing circuit comprises two inductive components, each of which has two ends, wherein one end thereof is electrically connected to one of the connecting circuits, while the other end thereof is electrically connected to the PCB through a conductive member; The capacitive component has two ends, and one of the ends is electrically connected to one of the connecting circuits, while the other one of the ends is electrically connected to the other one of the connecting circuits.

Whereby, the distance to transmit high-frequency signals can be effectively shortened, and the inductance generated on the signal paths is consequently reduced. Therefore, high-frequency test signals can be successfully transmitted to the DUT to be correctly detected.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
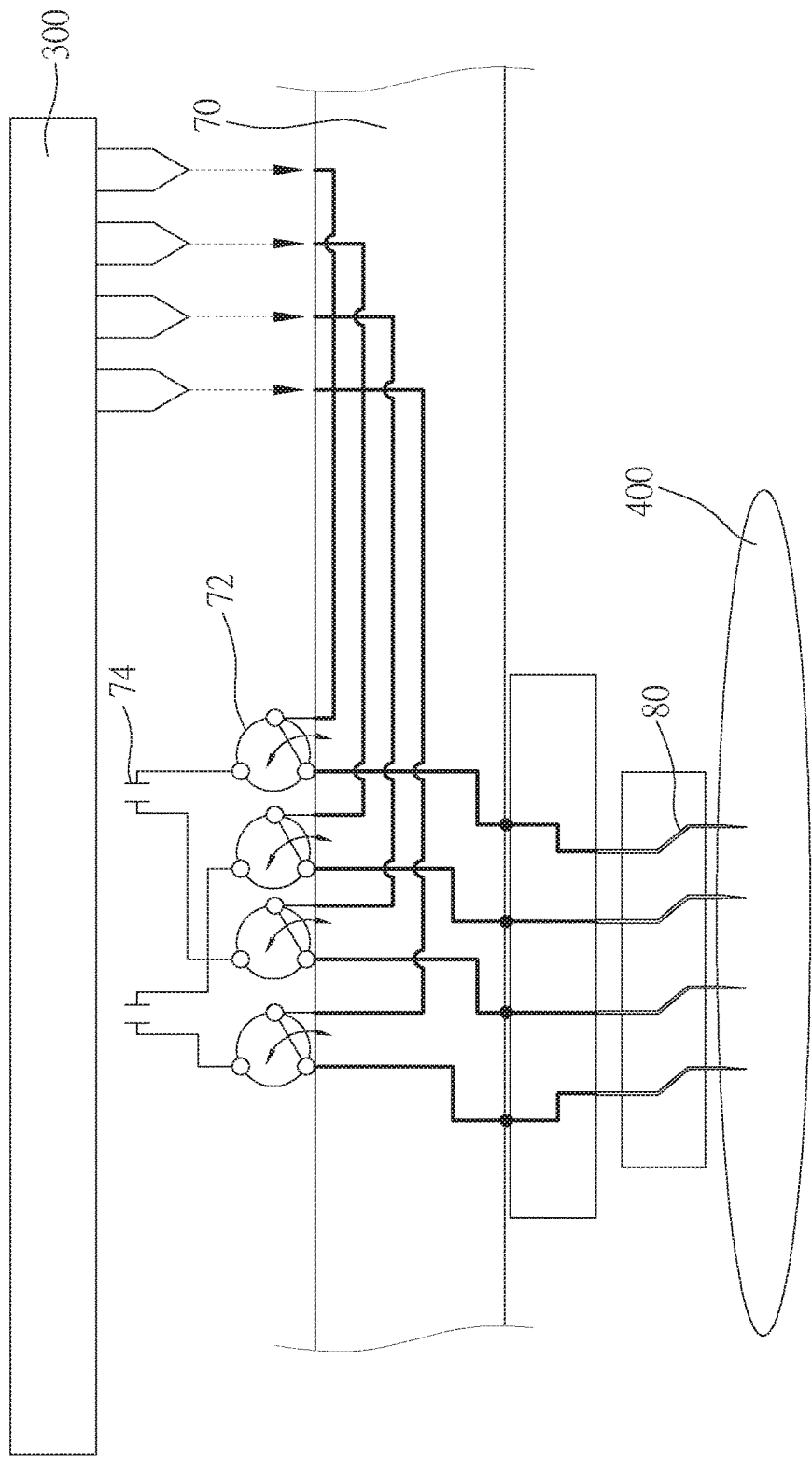
FIG. 1 is a structural diagram of a conventional probe card.
Figure 2:
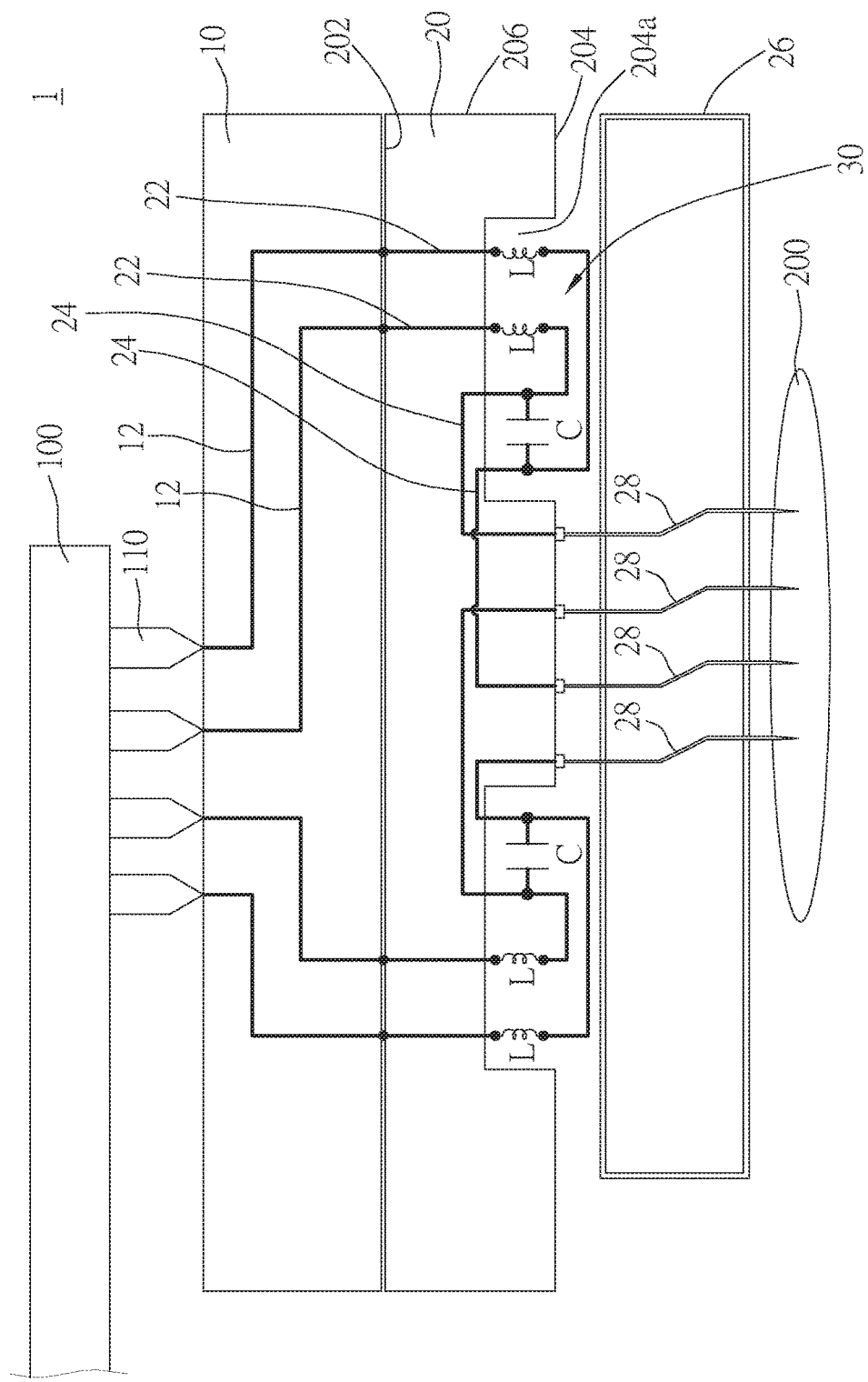
FIG. 2 is a structural diagram of the probe card which contains the probe module of a first embodiment of the present invention.

As shown in FIG. 2, a probe card 1 which contains a probe module of the first embodiment of the present invention is provided between a tester 100 and a DUT 200, wherein the probe card 1 further contains a PCB 10 in addition to the probe module. The PCB 10 has a plurality of signal circuits 12 laid within, wherein each signal circuit 12 has two ends. One end of each signal circuit 12 is connected to a test terminal 110 of the tester 100, while the other end forms a conductive land on a bottom surface of the PCB 10. As for the probe module, it contains an adapter, which is a substrate 20 as an example, a probe base 26, four probes 28, two path changing circuits 30, and two capacitive components C.

The substrate 20 is provided between the PCB 10 and the probe 28, and is adapted to transmit electrical signals between the signal circuits 12 of the PCB 10 and the probes 28. In the first embodiment, the substrate 20 is a multilayer ceramic plate. However, this is not a limitation of the present invention, and the substrate 20 could be a multilayer organic carrier board in other embodiments. The substrate 20 has a first surface 202, a second surface 204 opposite to the first surface 202, and a third surface 206, which connects the first surface 202 and the second surface 204, and surrounds a periphery of the first surface 202 and a periphery of the second surface 204. The first surface 202 faces the PCB 10, and the second surface 204 faces the DUT 200, wherein the second surface 204 has two recesses 204a recessed therefrom.

The substrate 20 is embedded with a plurality of conductive members, which are space changing circuits 22 as an example, and a plurality of connecting circuits 24, wherein an end of each of the space changing circuits 22 is electrically connected to one of the signal circuits 12 of the PCB 10; another end of each of two of the space changing circuits 22 respectively forms a contact on a bottom of one of the recesses 204a, wherein another end of each of other two of the space changing circuits 22 forms a contact on a bottom of the other one of the recesses 204a. An end of each of the connecting circuits 24 forms a contact on the second surface 204 of the substrate 20; another end of each of two of the connecting circuits 24 forms a contact on the bottom of one of the recesses 204a, while another end of each of other two of the connecting circuits 24 forms a contact on the bottom of the other one of the recesses 204a.

The probe base 26 is a hollow cuboid, and it is provided above the DUT 200 for the probes 28 to be installed thereon. A distance between each two neighboring probes 28 can be fixed in this way. Each probe 28 has a top end and a bottom end which is opposite to the top end, and the top end and the bottom end extend outside of the probe base 26, wherein the top end is electrically connected to one of the ends of one of the connecting circuits 24 by being connected to one of the conductive lands on the second surface of the substrate 20, while the bottom end, which is a tip in the first embodiment, contacts a tested pad on the DUT 200.

Each of the path changing circuits 30 includes two inductive components L, wherein each of the inductive components L is a choke in the first embodiment, but could be a different inductive component such as a coil, a winding, or a bead in other embodiments. Of course, each of the path changing circuits 30 could also be embodied by laying out metal circuits to provide inductivity. The inductive components L of one of the path changing circuits 30 is provided in one of the recesses 204a, wherein an end of each of the inductive components L is connected to one of the space changing circuits 22 by welding, while another end of each of the inductive components L is electrically connected to one of the connecting circuits 24. The inductive components L of the other one of the path changing circuits 30 are provided in the other one of the recesses 204a, and are also respectively connected to the other two of the space changing circuits 22 by welding. As a result, the inductive components L are electrically connected to the PCB 10 through the space changing circuits 22.

Each of the capacitive components C is a capacitor in the first embodiment, but could be replaced by other capacitive components, e.g., by laying out two metal circuits close without evoking physical contact to provide capacitance. The capacitive components C are respectively provided in the recesses 204a, and two ends of each of the capacitive components C are electrically connected to two adjacent connecting circuits 24 by welding.

Figure 3:
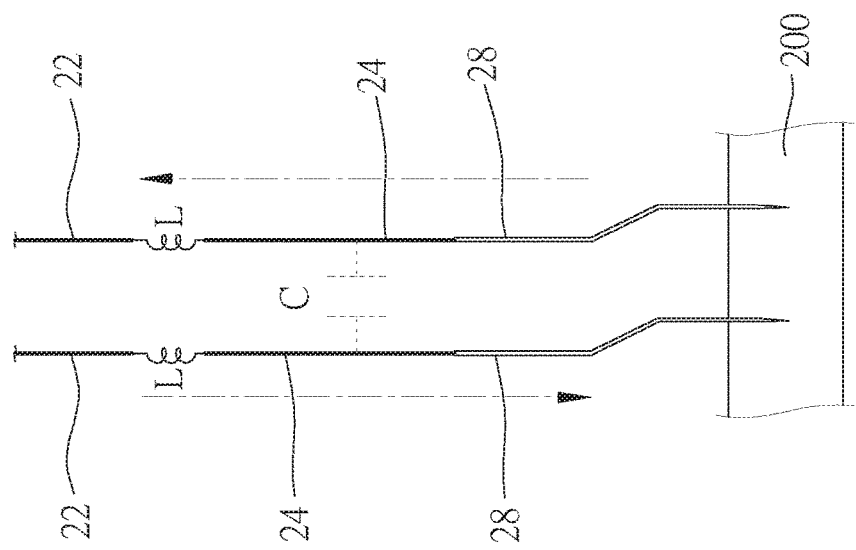
FIG. 3 is a schematic view, showing the signal path of the probe module of the first embodiment while transmitting DC or low-frequency signals.

Whereby, when direct current (DC) or low-frequency test signals are outputted from the test terminals 110 of the tester 100, a signal path, which is illustrated in FIG. 3, is formed by two of the probes 28 of the probe module, two of the inductive components L, and one of the capacitive components C, wherein the inductive components L are short-circuited or with low resistance, and the capacitive component C between two of the probes are open or with high impedance. At this time, once a test signal is outputted from any one of the test terminals 110 of the tester 100, it would be transmitted sequentially through one of the signal circuits 12 of the PCB 10, one of the path changing circuits 22, one of the inductive components L, one of the connecting circuits 24, one of the probes 28, and finally the DUT 200; after that, the test signal would be transmitted sequentially through another one of the probes 28, another one of the connecting circuits 24, another one of the inductive components L, another one of the path changing circuits 22, another one of the signal circuits 12 of the PCB 10, and finally back to the tester 100 through another one of the test terminals 110. As a result, the signal path of the test signal becomes a loop for performing the test.

Figure 4:
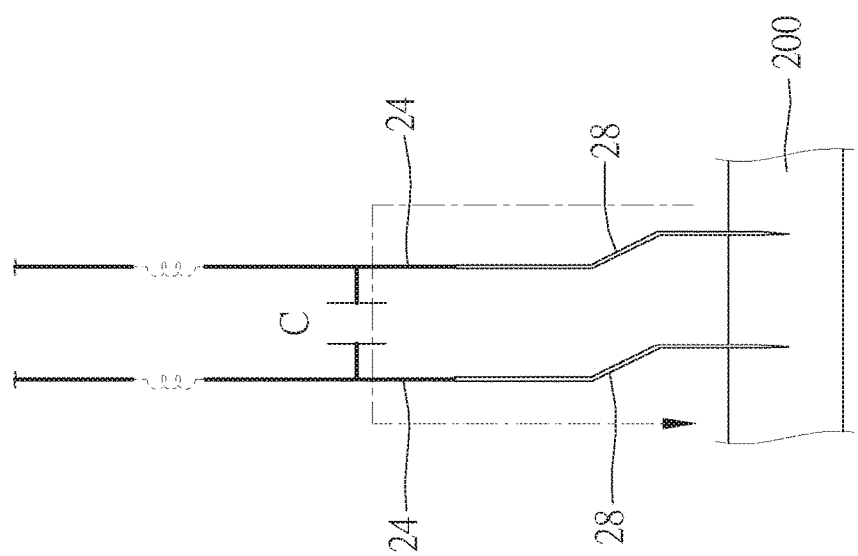
FIG. 4 is a schematic view, showing the signal path of the probe module of the first embodiment while transmitting high-frequency signals.

On the other hand, when high-frequency test signals are outputted by the DUT 200 to perform a loopback test, a signal path, which is illustrated in FIG. 4, is formed by two of the probes 28 of the probe module, two of the inductive components L, and one of the capacitive components C, wherein the inductive components L are open or with high impedance, and the capacitive component C is short-circuited or with low impedance. At this time, once a test signal is outputted by the DUT 200, it would be transmitted sequentially through one of the probes 28, one of the connecting circuits 24, and one of the capacitive components C. And then, the signal would be transmitted continuously through another one of the connecting circuits 24, another one of the probes 28, and finally back to the DUT 200, which makes the signal path of the signal become a very short loop to perform a loopback test.

Figure 5:
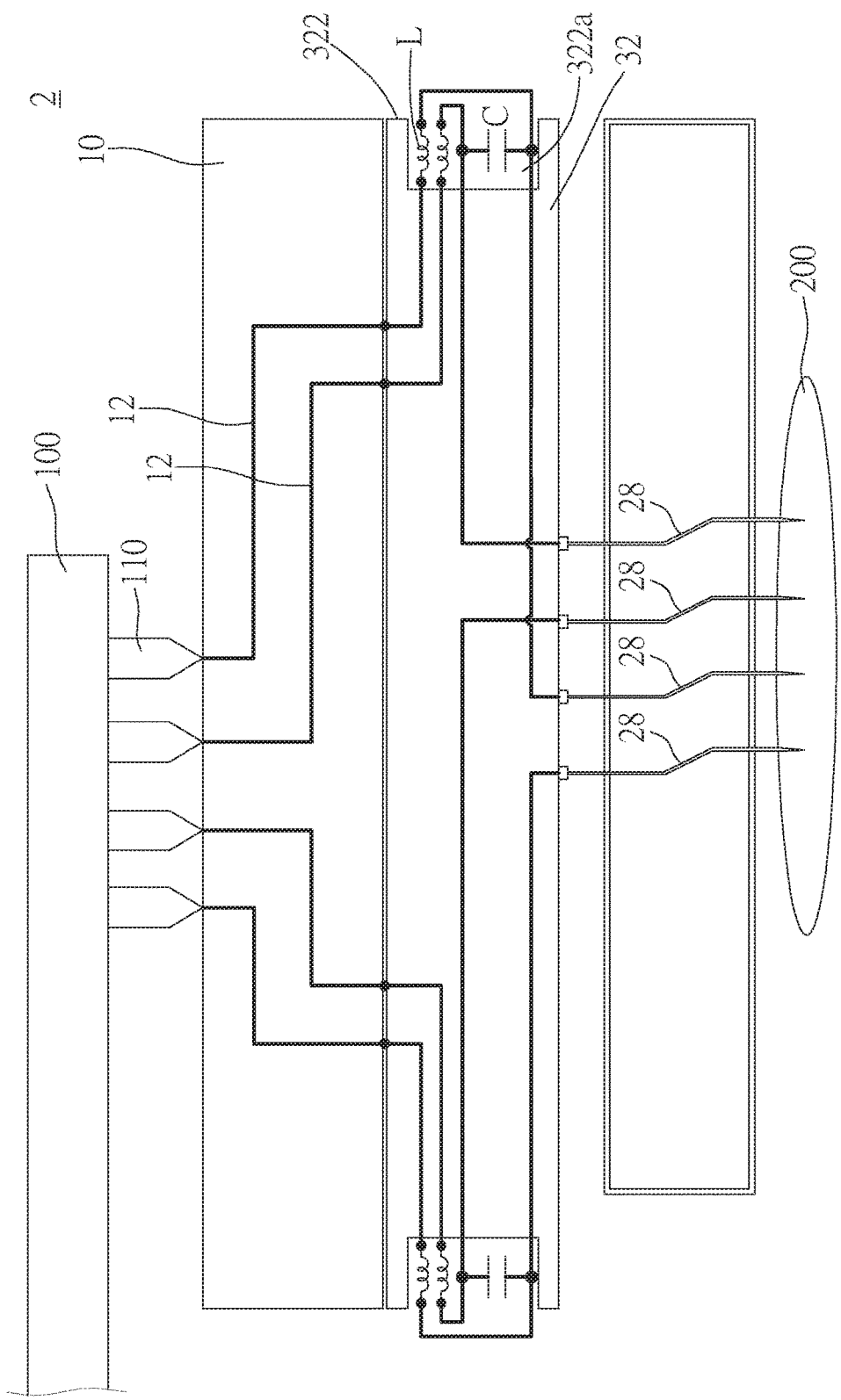
FIG. 5 is a structural diagram of the probe card which contains the probe module of a second embodiment of the present invention.

A probe card 2 which contains a probe module of a second embodiment of the present invention is illustrated in FIG. 5, wherein the probe card 2 has roughly the same structure with that of the first embodiment, and also includes a PCB 10. The difference between the probe card 1 of the first embodiment and the probe card 2 of the second embodiment is that, two recesses 322a of a substrate 32 are recessed into a third surface 322 of the substrate 32, and are located on two opposite sides on the third surface 322. Each of the recesses 322a is provided with two inductive components L and a capacitive component C, wherein the connection relation between these components are identical to that of the first embodiment, and therefore we are not going to describe it in details herein.

Figure 6:
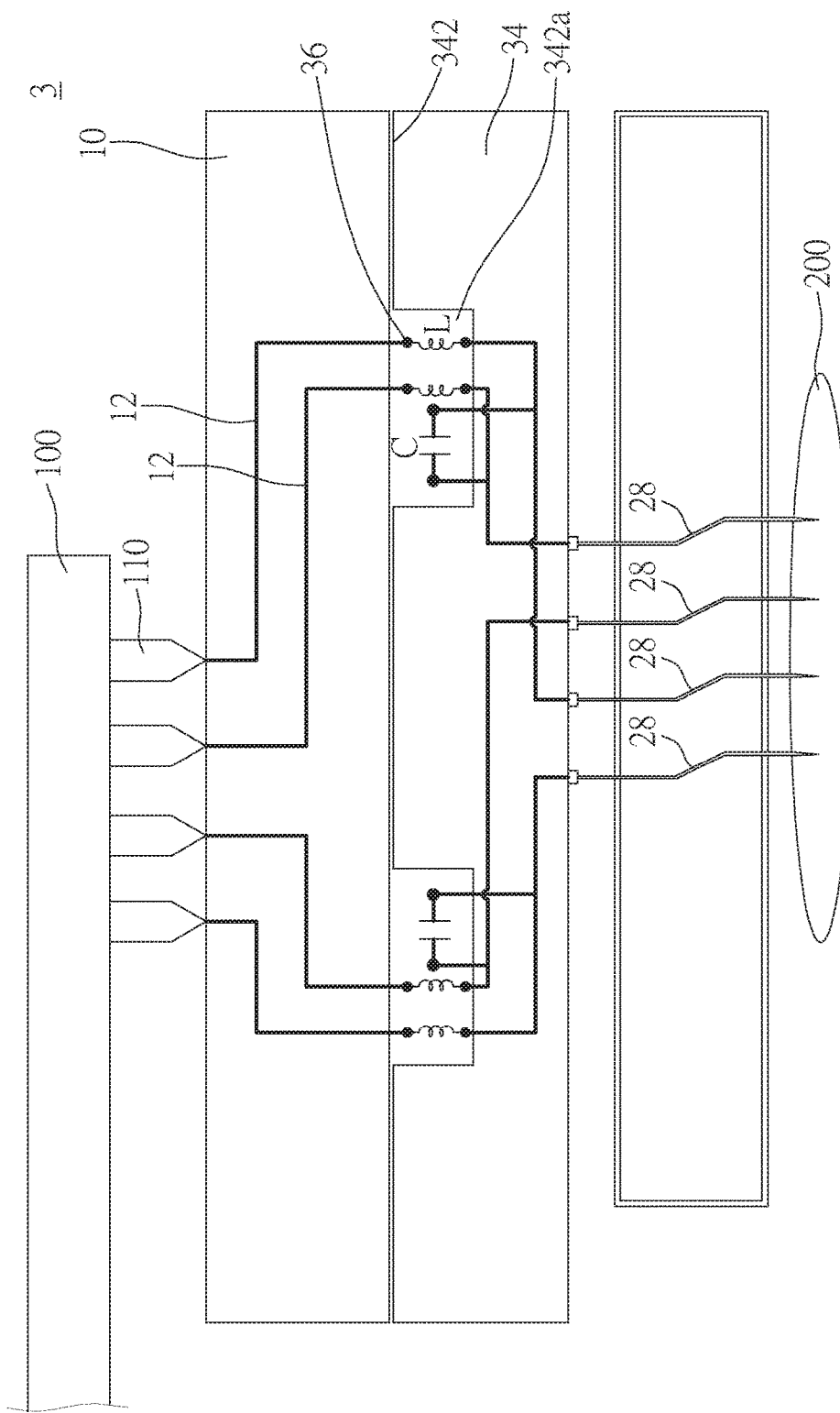
FIG. 6 is a structural diagram of the probe card which contains the probe module of a third embodiment of the present invention

A probe card 3 which contains a probe module of a third embodiment of the present invention is illustrated in FIG. 6, wherein the probe card 3 has roughly the same structure with that of the first embodiment, and also includes a PCB 10. The difference between the probe card 1 of the first embodiment and the probe card 3 of the third embodiment is that, two recesses 342a of a substrate 34 are recessed into a first surface 342 of the substrate 34. Each of the recesses 342a is provided with two inductive components L and a capacitive component C. Each of the inductive components L is electrically connected to one of the signal circuits 12 of the PCB 10 through a conductive member, which is a welding material 36 as an example.

Figure 7:
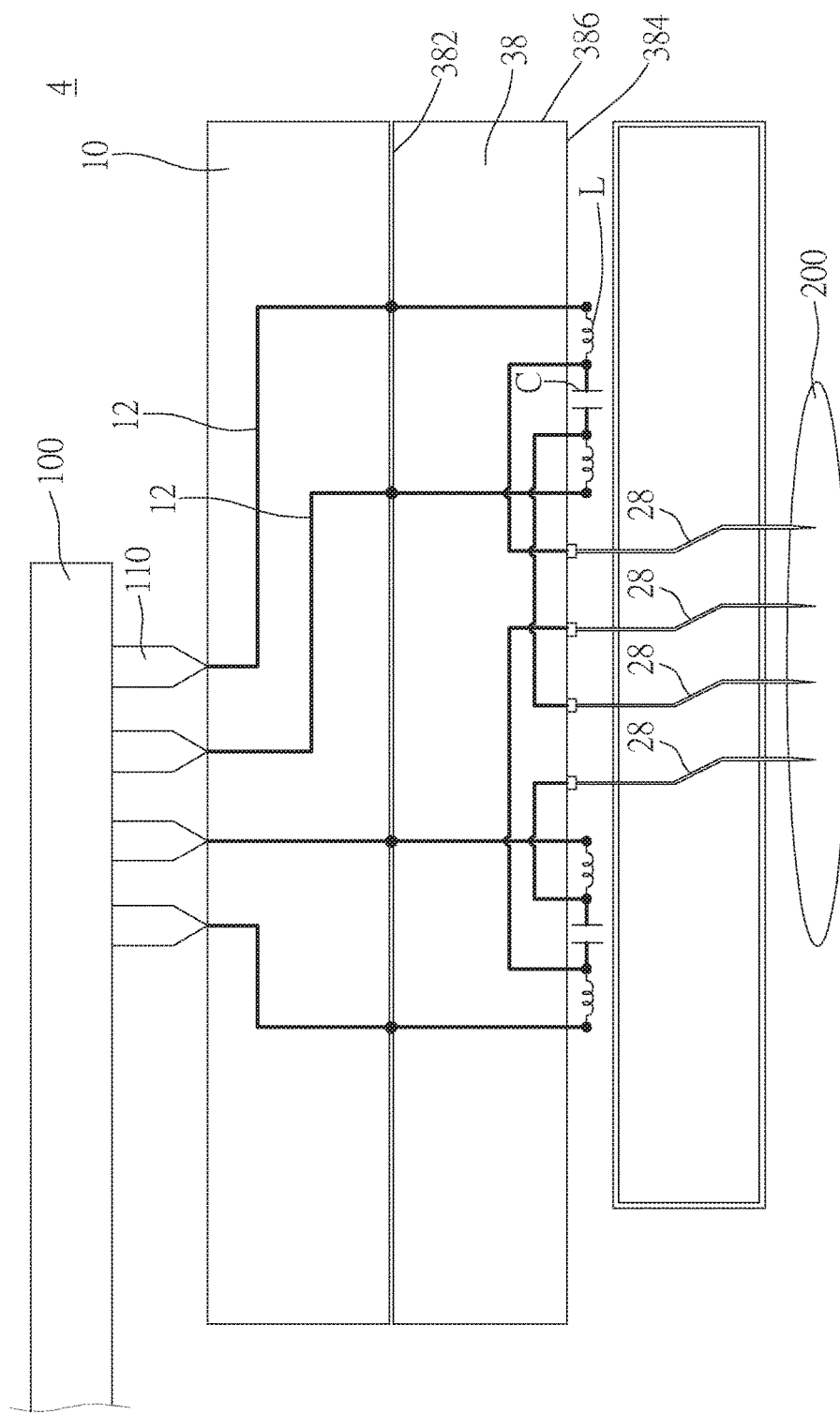
FIG. 7 is a structural diagram of the probe card which contains the probe module of a fourth embodiment of the present invention.

A probe card 4 which contains a probe module of a fourth embodiment of the present invention is illustrated in FIG. 7, wherein the probe card 4 has roughly the same structure with that of the first embodiment, and also includes a PCB 10. The difference between the probe card 1 of the first embodiment and the probe card 4 of the fourth embodiment is that, a substrate 38 of the fourth embodiment has no recess provided thereon. Instead, four inductive components L and two capacitive components C are all provided on a second surface 382 of the substrate 38. In practice, the inductive components L and the capacitive component C could also be provided on a first surface 384 or a third surface 386 of the substrate 38.

In the fourth embodiment, the adapter is the substrate 38 made of a multilayer ceramic plate or a multilayer organic carrier board. In practice, a film structure could be further provided on a bottom of the multilayer ceramic plate or the multilayer organic carrier board to form an adapter including the film structure and the substrate. A plurality of wires could be provided in the film structure, wherein a distance between each two adjacent wires is less than that between each two adjacent space changing circuits and that between each two connecting circuits. The wires could be respectively electrically connected to the space changing circuits and the connecting circuits, forming a thin-film multilayer ceramic plate or a thin-film multilayer organic carrier board. In such case, the inductive components and the capacitive components could be provided on a surface of the film structure which faces the DUT, and the inductive components and the capacitive components are electrically connected to the space changing circuits and the connecting circuits through the wires of the film structure.

Of course, the adapter could have no substrate, with the film structure directly provided on the bottom surface of the PCB 10 to electrically connect the wires and the signal circuits 12, respectively, which means that the film structure would directly transmit signals between the PCB and the probes. In such case, the wires of the film structure would become the space changing circuits and the connecting circuits which connect the inductive components and the capacitive components. In addition, the adapter could be a chip with wires which is made by semiconductor process, and such a chip could be provided on the bottom of the PCB 10 to make the wires therein directly connected to the signal circuits 12 of the PCB 10, respectively, and the inductive components and the capacitive components could be provided on a surface of the chip which faces the DUT.

In each of the aforementioned embodiments, each pair of one of the path changing circuits and the electrically connected capacitive component C is provided on the same surface of the adapter. In practice, the path changing circuits and the capacitive components could also be provided on different surfaces of the substrate of the adapter. For example, either the path changing circuits or the capacitive components are provided on the first surface, while the other ones are provided on the second surface or the third surface; or alternatively, either the path changing circuits or the capacitive components are provided on the second surface, while the other ones are provided on the first surface or the third surface; or, either the path changing circuits or the capacitive components are provided on the third surface, while the other ones are provided on the first surface or the second surface. The detailed explanation is as follows.

Figure 8:
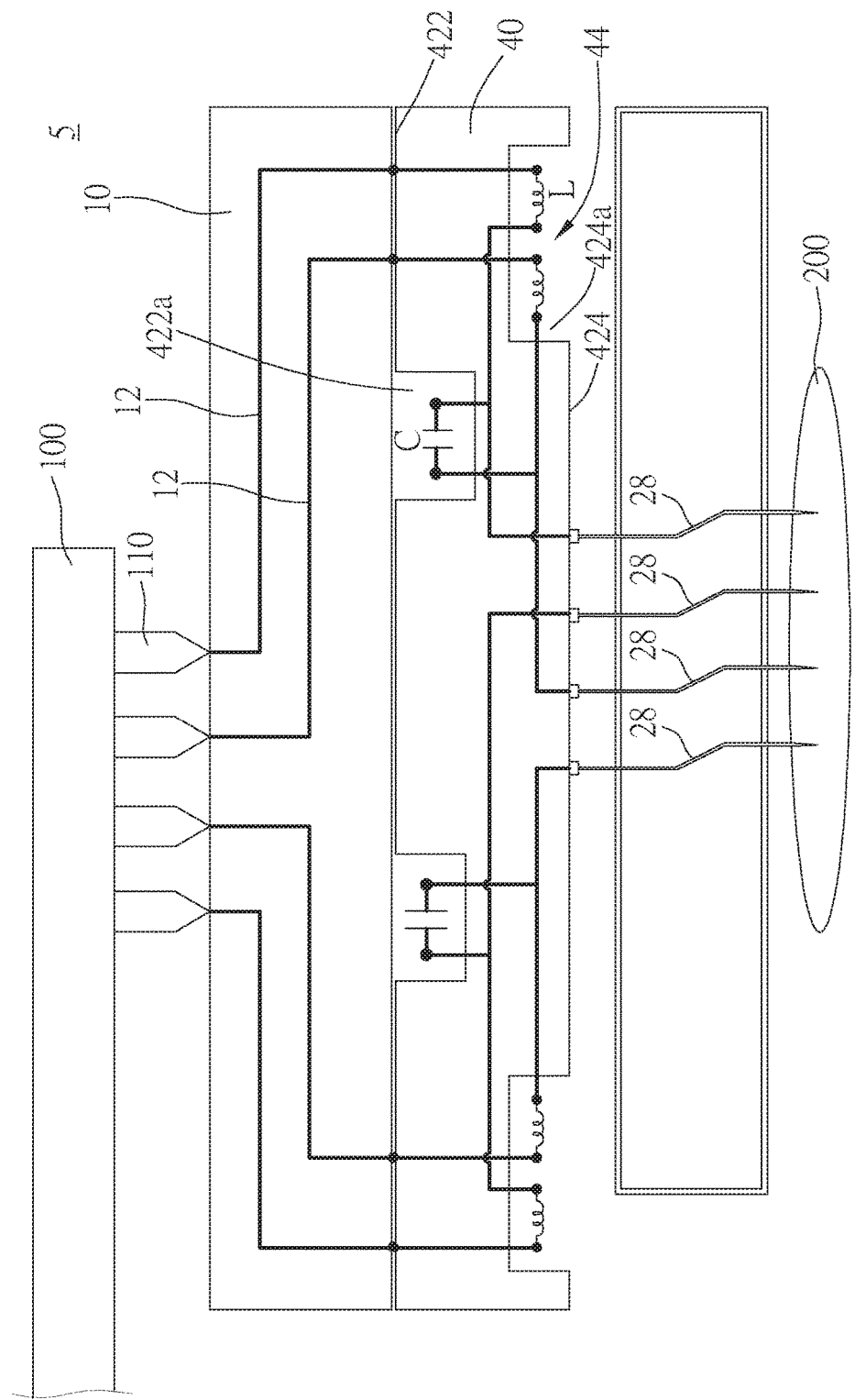
FIG. 8 is a structural diagram of the probe card which contains the probe module of a fifth embodiment of the present invention.

A probe card 5 which contains a probe module of a fifth embodiment of the present invention is illustrated in FIG. 8, wherein the probe card 5 has roughly the same structure with that of the first embodiment, and also includes a PCB 10. The difference between the probe card 1 of the first embodiment and the probe card 5 of the fifth embodiment is that, two first recesses 422a are recessed into a first surface 422 of a substrate 40, two second recesses 424a are recessed into a second surface 424 thereof. In the fifth embodiment, two capacitive components C are respectively provided in the first recesses 422a, and two path changing circuits 44 are respectively provided in the second recesses 424a. In practice, the second surface 424 could also be provided with four second recesses 424a, so that the inductive components L of the path changing circuits 44 could be respectively provided in the four second recesses 424a.

Figure 9:
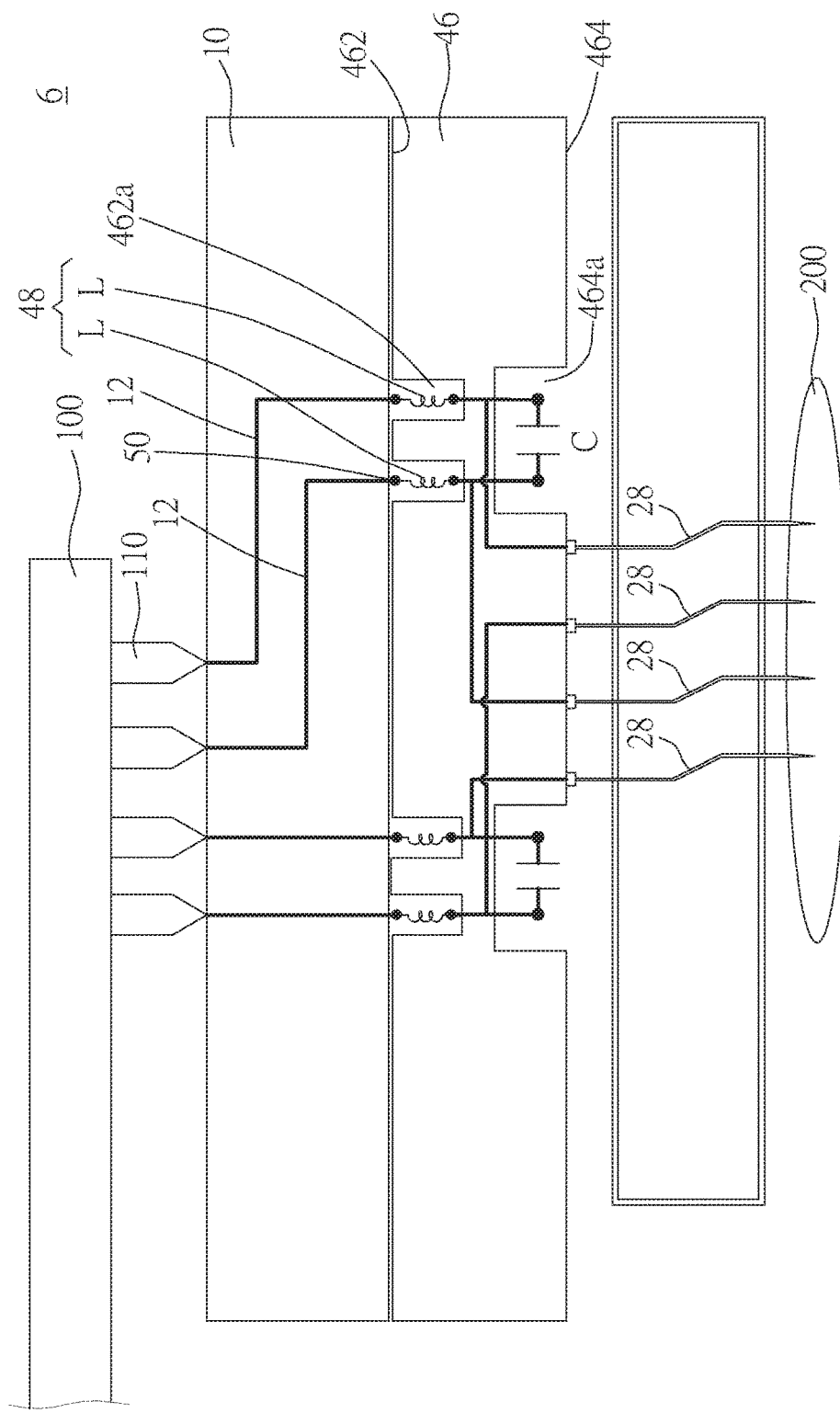
FIG. 9 is a structural diagram of the probe card which contains the probe module of a sixth embodiment of the present invention.

A probe card 6 which contains a probe module of a sixth embodiment of the present invention is illustrated in FIG. 9, wherein the probe card 6 has roughly the same structure with that of the fifth embodiment, and also includes a PCB 10. The difference between the probe card 5 of the fifth embodiment and the probe card 6 of the sixth embodiment is that, in the sixth embodiment, a first surface 462 of a substrate 46 has four first recesses 462a recessed therefrom, and a second surface 464 thereof has two second recesses 464a recessed therefrom. Four inductive components L of the path changing circuits 48 in the sixth embodiment are respectively provided the first recesses 462a, and each of the inductive components L is electrically connected to one of the signal circuits 12 of the PCB 10 through a conductive member which is a welding material 50 as an example. Two capacitive components C are respectively provided in the second recesses 464a.

Figure 10:
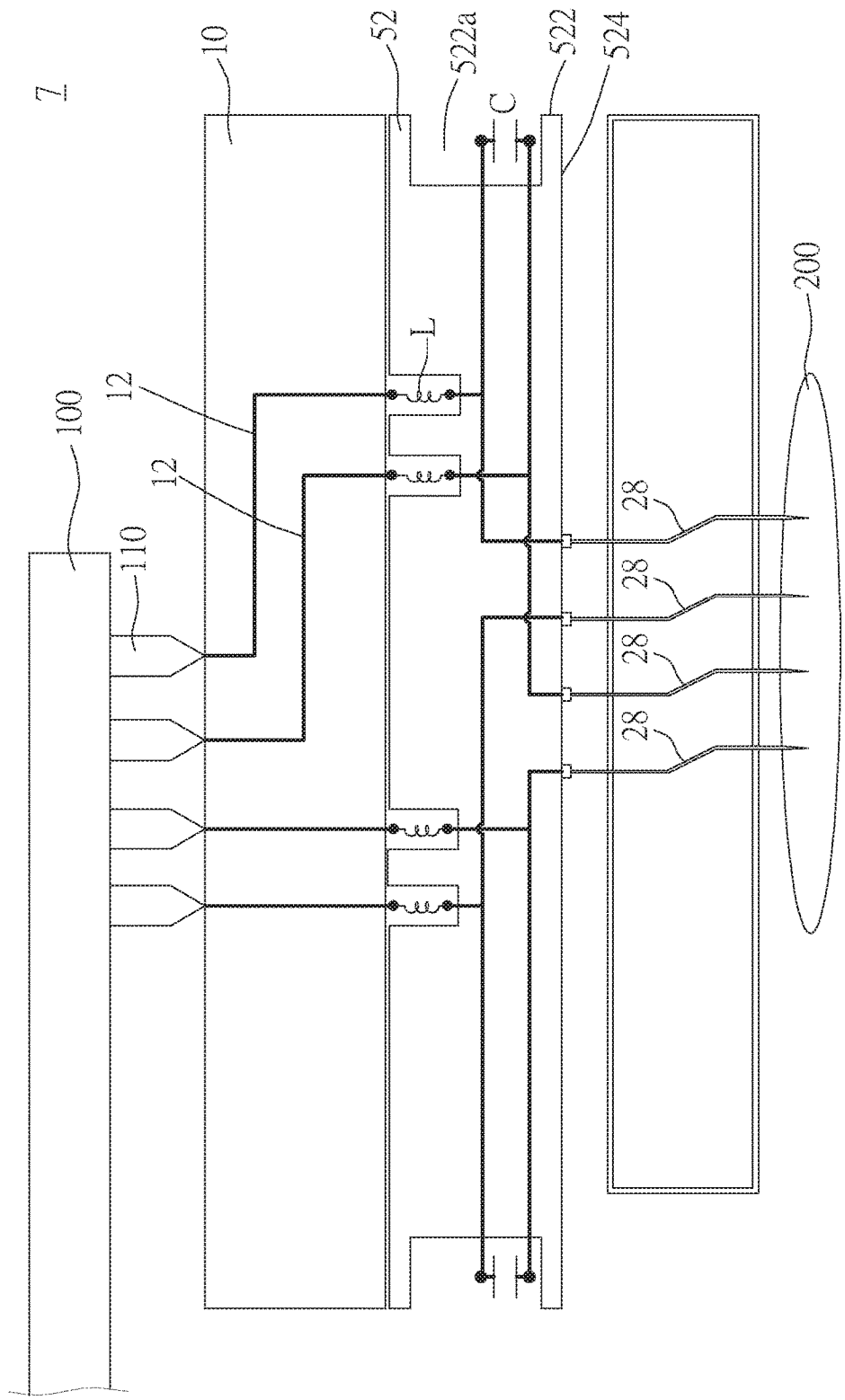
FIG. 10 is a structural diagram of the probe card which contains the probe module of a seventh embodiment of the present invention.

A probe card 7 which contains a probe module of a seventh embodiment of the present invention is illustrated in FIG. 10, wherein the probe card 7 has roughly the same structure with that of the sixth embodiment, and also includes a PCB 10. The difference between the probe card 6 of the sixth embodiment and the probe card 7 of the seventh embodiment is that, in the seventh embodiment, two second recesses 522a are respectively recessed into two opposite sides on a third surface 522 of a substrate 52, and two capacitive components C are respectively provided in the second recesses 522a. In practice, a second surface 524 could have two or four first recesses recessed therefrom. In the case of two first recesses, each of the path changing circuits is respectively provided in one of the first recesses on the second surface 524; in the case of four first recesses, each of four inductive components L is respectively provided in one of the first recesses on the second surface 524.

In the sixth and the seventh embodiments, the inductive components L of the path changing circuits could be, in practice, provided in one single first recess. Alternatively, the first surface of the substrate could be provided with two first recesses thereon, with each of the path changing circuits respectively provided in one of the first recesses.

Figure 11:
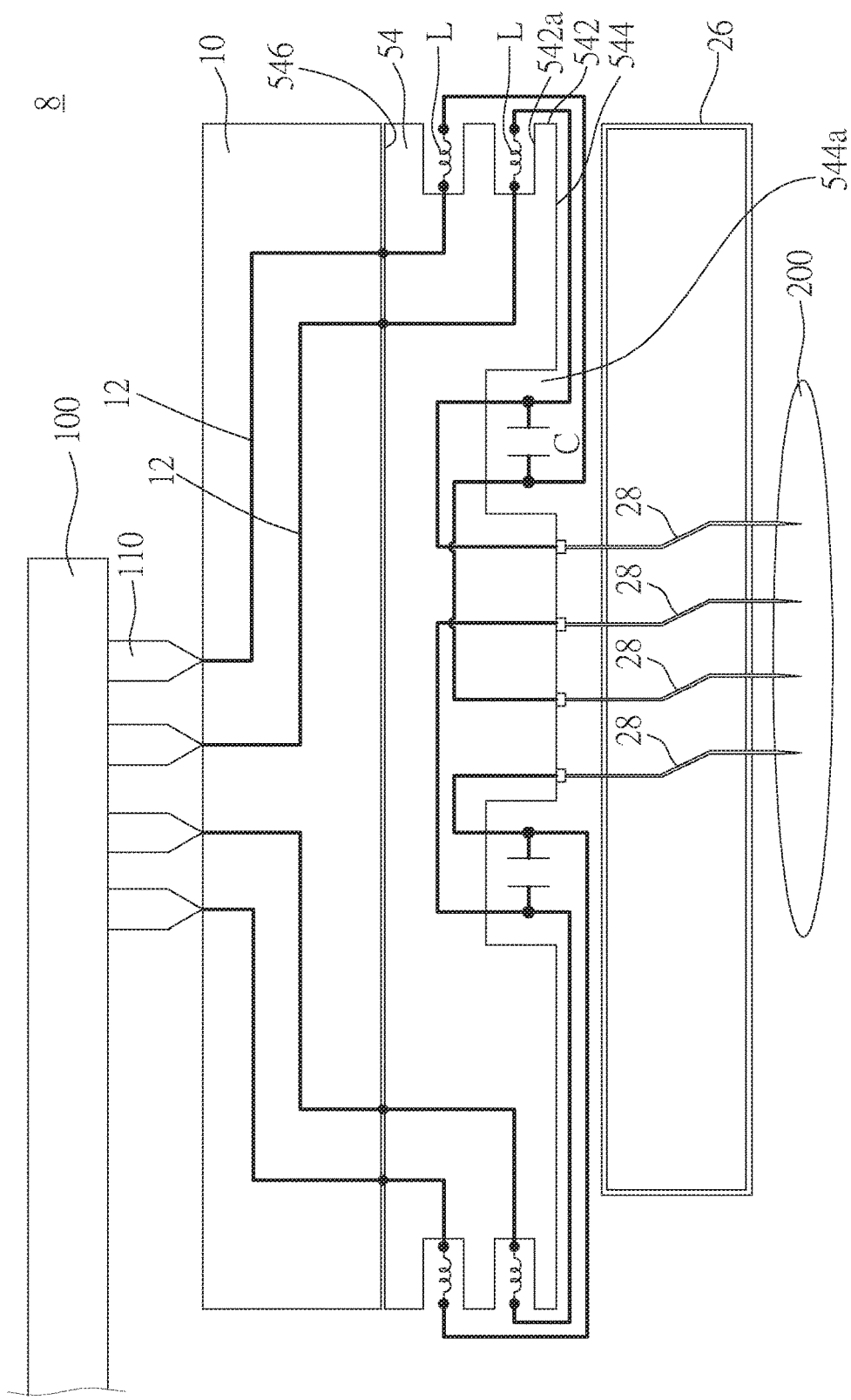
FIG. 11 is a structural diagram of the probe card which contains the probe module of an eighth embodiment of the present invention.

A probe card 8 which contains a probe module of an eighth embodiment of the present invention is illustrated in FIG. 11, wherein the probe card 8 has roughly the same structure with that of the sixth embodiment, and also includes a PCB 10. The difference between the probe card 8 of the eighth embodiment and the probe card 6 of the sixth embodiment is that, in the eighth embodiment, two first recesses 542a are recessed into each of two opposite sides of a third surface 542 of a substrate 54, and two inductive components L of each of the path changing circuits are respectively provided in two of the first recesses 542a on the same side. Two capacitive components C are respectively provided in two second recesses 544a on a second surface 544. In practice, a first recess could be recessed into each of two opposite sides of the third surface 542, with two path changing circuits respectively provided in the first recesses. In addition, two first recesses could be provided on a first surface 546, with the capacitive components C provided in the second recesses on the first surface 546.

In the aforementioned fifth to the eighth embodiments, the path changing circuits and the capacitive components C are respectively provided in the recesses on different surfaces on different sides of the substrate of the adapter. However, the path changing circuits and the capacitive components C could be directly provided on surfaces on two different sides without being disposed in any recesses. In this way, the recesses for receiving the path changing circuits or the capacitive components C could be omitted. Alternatively, there could be either the path changing circuits or the capacitive components C provided in the recesses on one surface, with the other ones provided on the surface on another side.

Figure 12:
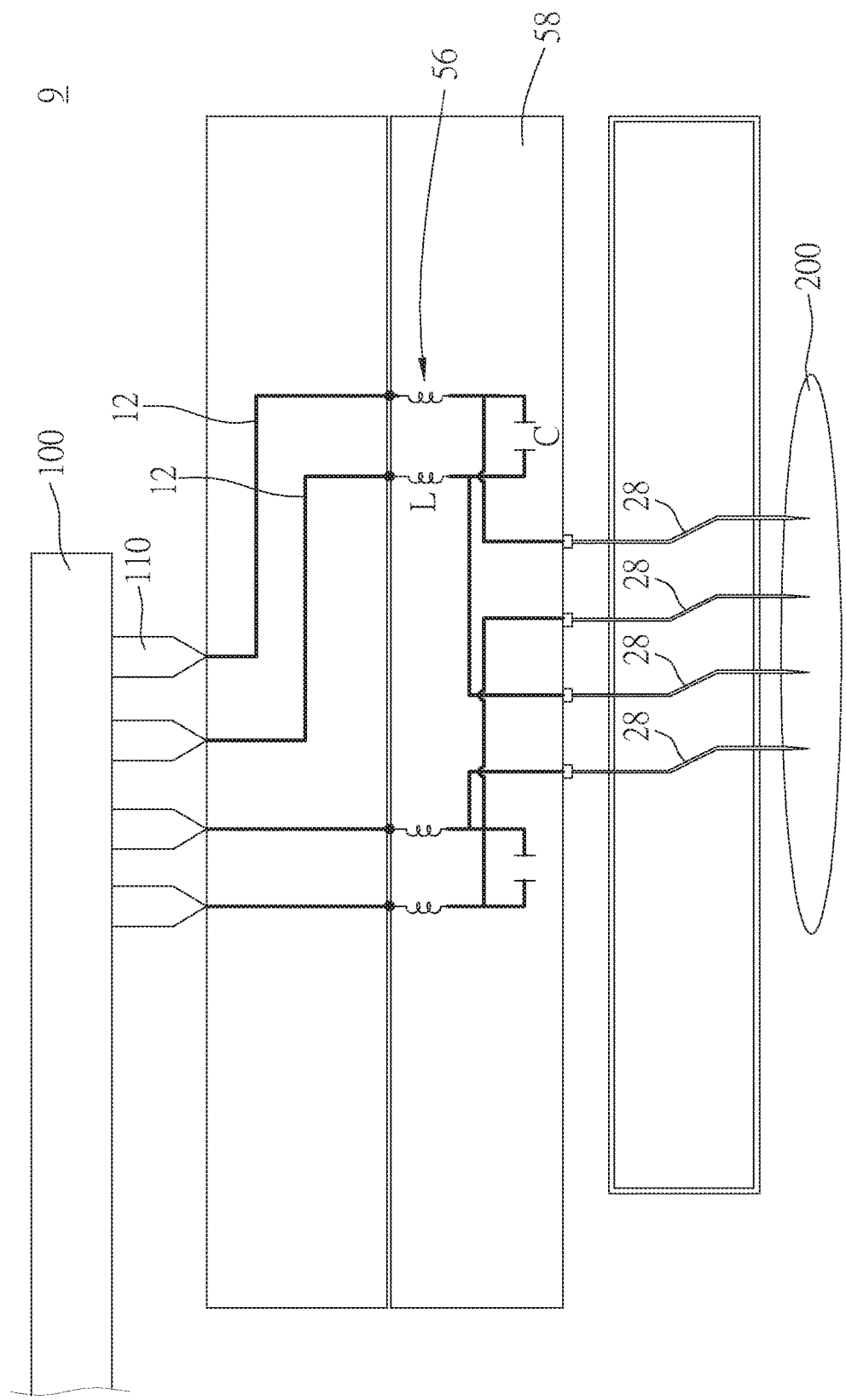
FIG. 12 is a structural diagram of the probe card which contains the probe module of a ninth embodiment of the present invention.

A probe card 9 which contains a probe module of a ninth embodiment of the present invention is illustrated in FIG. 12, wherein the probe card 9 has roughly the same structure with that of the sixth embodiment, and also includes a PCB 10. The difference between the probe card 9 of the ninth embodiment and the probe card 6 of the sixth embodiment is that, in the ninth embodiment, the path changing circuits 56 and the capacitive components C are all embedded in a substrate 58.

Figure 13:
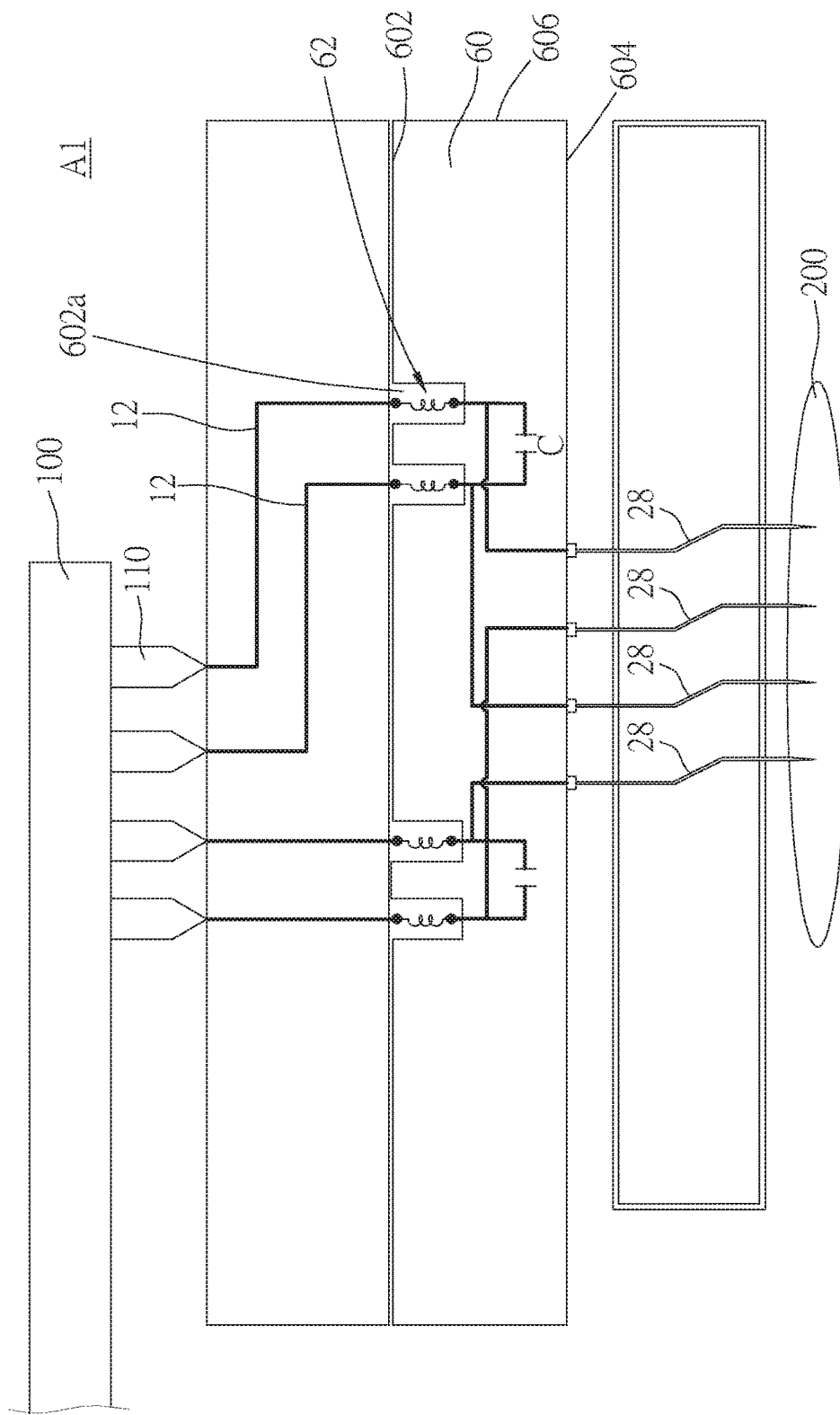
FIG. 13 is a structural diagram of the probe card which contains the probe module of a tenth embodiment of the present invention.

A probe card A1 which contains a probe module of a tenth embodiment of the present invention is illustrated in FIG. 13, wherein the probe card A1 has roughly the same structure with that of the ninth embodiment, and also includes a PCB 10. The difference between the probe card A1 of the tenth embodiment and the probe card 9 of the ninth embodiment is that, in the tenth embodiment, four recesses 602a are recessed into a first surface 602 of a substrate 60, and four inductive components L of two path changing circuits 62 are respectively provided in the recesses 602a. In practice, the recesses are not limited to be provided on the first surface 602, and could also be located on a second surface 604 or a third surface 606. The path changing circuits 62 could be even provided on one surface among the first surface 602, the second surface 604, and the third surface 606.

Figure 14:
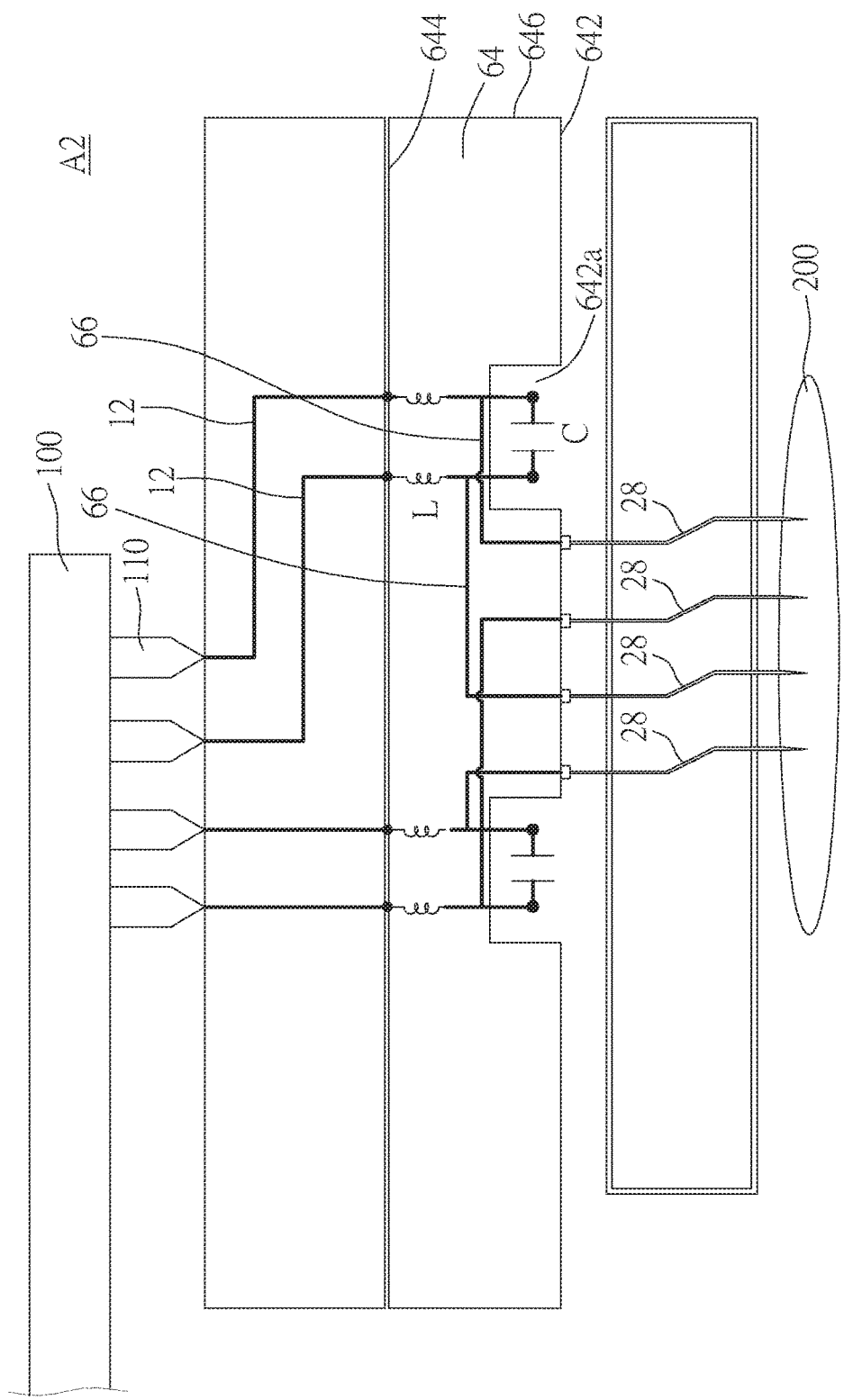
FIG. 14 is a structural diagram of the probe card which contains the probe module of an eleventh embodiment of the present invention.
Figure 15:
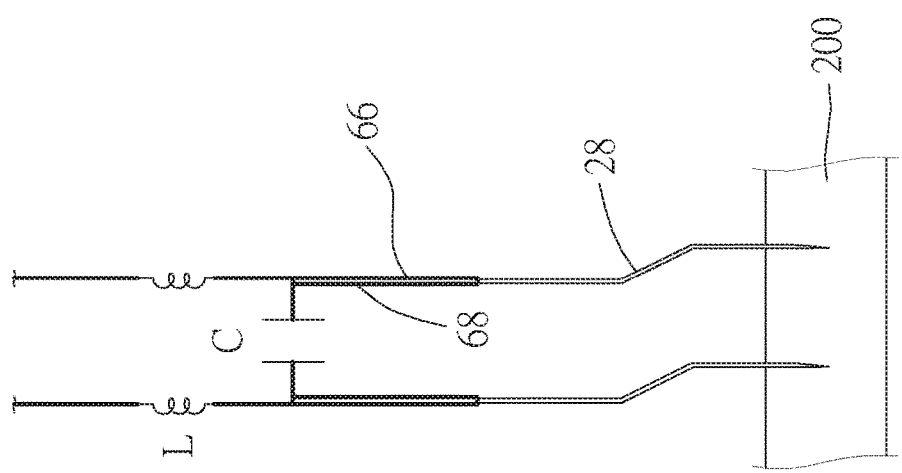
FIG. 15 is a schematic view, showing that the probe module of the eleventh embodiment further includes two more connecting circuits.

A probe card A2 which contains a probe module of an eleventh embodiment of the present invention is illustrated in FIG. 14, wherein the probe card A2 has roughly the same structure with that of the ninth embodiment, and also includes a PCB 10. The difference between the probe card A2 of the eleventh embodiment and the probe card 9 of the ninth embodiment is that, in the eleventh embodiment, two recesses 642a are recessed on a second surface 642 of a substrate 64, and two capacitive components C are respectively provided in the recesses 642a. In practice, the recesses are not limited to be provided on the second surface 642, and could be disposed on a first surface 644 or a third surface 646. The capacitive components C could be even provided on one surface among the first surface 644, the second surface 642, and the third surface 646. Also, in the eleventh embodiment, each of two ends of each of the capacitive components C is respectively electrically connected to a probe 28 through a connecting circuit 66. In practice, there could be another connecting circuit 68 provided beside each of the connecting circuits 66 (as shown in FIG. 15), which makes each end of each of the capacitive components C electrically connected to one of the probes 28 through two parallel connecting circuits 66, 68. With the connecting circuits 66, 68 connected in parallel, the impedance between each end of each of the capacitive components C and the corresponding probe 28 could be reduced, so that the performance of transmitting signals could be enhanced. Such parallel connected connecting circuits 66, 68 could also be applied in the first to the tenth embodiments.

In each embodiment among the first to the eleventh embodiments, the probe module includes two path changing circuits, two capacitive components, and four probes. However, such arrangement is just an example. In practice, the probe module could only include at least one path changing circuit, one capacitive component, and two probes.

In the present invention, the signal paths could be changed in real time due to the differences between the frequencies of signals, and such effect is achieved simply because the electrical properties of the inductive components and the capacitive components. No additional electrical power is required. With the aforementioned design, the distance for transmitting high-frequency signals can be effectively shortened, which not only greatly reduces resistance along the signal paths, but also effectively prevents the high-frequency signals from being interfered by electric components or circuits on a PCB. Therefore, the high-frequency test signals which return to a DUT can be easily recognized.

It must be pointed out that the embodiments described above are only some embodiments of the present invention. In addition to being applied to the vertical probes shown in the aforementioned embodiments, the concept of the present invention could also be applied to MEMS probes, cantilever probes, or other types of probes. All equivalent structures which employ the concepts disclosed in this specification and the appended claims should fall within the scope of the present invention.

What is claimed is:

1. A probe module, which is provided between a printed circuit board (PCB) and a device-under-test (DUT) to perform a loopback test, comprising:
    an adapter, which has a surface, and is provided with two connecting circuits;
    two probes, wherein each of which has an end electrically connected to one of the connecting circuits, while another end thereof, which is a tip, contacts a tested pad on the DUT;
    two inductive components provided at the surface of the adapter, wherein each of the inductive components has two ends, and one of the ends is electrically connected to one of the connecting circuits, while the other one of the ends is electrically connected to the PCB through a conductive member; and
    a capacitive component provided at the surface of the adapter, wherein the capacitive component has two ends, and one of the ends is electrically connected to one of the connecting circuits, while the other one of the ends is electrically connected to the other one of the connecting circuits.

2. The probe module of claim 1, wherein the adapter has a first surface, a second surface opposite to the first surface, and a third surface located between the first surface and the second surface; the first surface faces the PCB, and the second surface faces the DUT; the surface belongs to one among the first surface, the second surface, and the third surface.

3. The probe module of claim 1, wherein the adapter is further provided with two more connecting circuits, which are connected to the connecting circuits in parallel.

4. A probe module, which is provided between a printed circuit board (PCB) and a device-under-test (DUT) to perform a loopback test, comprising:
    a substrate, which has a recess thereon, and is provided with two connecting circuits;
    two probes, wherein each of which has an end electrically connected to one of the connecting circuits, while another end thereof, which is a tip, contacts a tested pad on the DUT;
    two inductive components provided in the recess of the substrate, wherein each of the inductive components has two ends, and one of the ends is electrically connected to one of the connecting circuits, while the other one of the ends is electrically connected to the PCB through a conductive member; and a capacitive component provided in the recess of the substrate, wherein the capacitive component has two ends, and one of the ends is electrically connected to one of the connecting circuits, while the other one of the ends is electrically connected to the other one of the connecting circuits.

5. The probe module of claim 4, wherein the substrate has a first surface, a second surface opposite to the first surface, and a third surface located between the first surface and the second surface; the first surface faces the PCB, and the second surface faces the DUT; the recess is recessed into one among the first surface, the second surface, and the third surface.

6. The probe module of claim 4, wherein the substrate is further provided with two more connecting circuits, which are connected to the connecting circuits in parallel.

* * * * *